(12) United States Patent
Gupta et al.

(10) Patent No.: US 10,575,429 B2
(45) Date of Patent: Feb. 25, 2020

(54) ADJUSTABLE CABLE MANAGEMENT SLIDE AND DIRECTION CONTROL FOR OPTIMIZED ROUTING

(71) Applicant: Cisco Technology, Inc., San Jose, CA (US)

(72) Inventors: Rohit Dev Gupta, Bangalore (IN); Joel R. Goergen, Soulsbyville, CA (US); Jatin Kohli, Bangalore (IN)

(73) Assignee: Cisco Technology, Inc., San Jose, CA (US)

( * ) Notice: Subject to any disclaimer, the term of this patent is extended or adjusted under 35 U.S.C. 154(b) by 175 days.

(21) Appl. No.: 15/641,787

(22) Filed: Jul. 5, 2017

(65) Prior Publication Data
US 2018/0288896 A1   Oct. 4, 2018

Related U.S. Application Data

(60) Provisional application No. 62/481,357, filed on Apr. 4, 2017.

(51) Int. Cl.
| | |
|---|---|
| *H05K 7/14* | (2006.01) |
| *F16L 3/223* | (2006.01) |
| *F16L 3/16* | (2006.01) |
| *G02B 6/44* | (2006.01) |

(52) U.S. Cl.
CPC ............. *H05K 7/1491* (2013.01); *F16L 3/16* (2013.01); *F16L 3/2235* (2013.01); *G02B 6/4452* (2013.01)

(58) Field of Classification Search
CPC ........ H05K 7/1491; F16L 3/16; F16L 3/2235; G02B 6/4457; G02B 6/4452; G02B 6/444; H04Q 1/06

USPC .......................................................... 248/68.1
See application file for complete search history.

(56) References Cited

U.S. PATENT DOCUMENTS

| | | | | |
|---|---|---|---|---|
| 2,859,710 | A * | 11/1958 | Elsner | A47B 91/08 248/502 |
| 3,255,987 | A * | 6/1966 | Gatch | F16B 21/02 108/156 |
| 6,398,149 | B1 * | 6/2002 | Hines | A47B 21/06 242/388.6 |
| 6,435,354 | B1 | 8/2002 | Gray et al. | |

(Continued)

OTHER PUBLICATIONS

International Search Report and Written Opinion dated Jul. 26, 2018 in connection with PCT/US2018/024306.

*Primary Examiner* — Nkeisha Smith
(74) *Attorney, Agent, or Firm* — Behmke Innovation Group LLC; James Behmke; Stephen D. LeBarron

(57) ABSTRACT

In one embodiment, an apparatus is disclosed comprising a cable management bracket and a cable guide connector configured to engage a slot of a networking chassis having a length extending along a first axis. The cable guide connector comprises a center section configured to slide within the slot along the first axis and having an aperture configured to receive a retainer to secure the cable guide connector by compression at a selected position along the length of the slot. The cable guide connector further defines a plurality of apertures configured to engage a protrusion of the cable management bracket and defines a plurality of selectable angles at which the cable management bracket can be positioned relative to a second axis that is perpendicular to the first axis through which the slot extends.

20 Claims, 16 Drawing Sheets

(56) References Cited

U.S. PATENT DOCUMENTS

| | | | |
|---|---|---|---|
| 6,510,955 B2 * | 1/2003 | Pellegrino | F16B 7/0446 |
| | | | 211/192 |
| 6,595,379 B1 * | 7/2003 | Powell | A47B 57/50 |
| | | | 211/192 |
| 6,771,872 B2 * | 8/2004 | Wu | G02B 6/4471 |
| | | | 385/136 |
| 7,083,051 B2 * | 8/2006 | Smith | G02B 6/4452 |
| | | | 211/26 |
| 7,189,924 B1 | 3/2007 | Popescu et al. | |
| 7,431,610 B2 * | 10/2008 | Laursen | H04Q 1/064 |
| | | | 211/26 |
| 7,627,223 B1 * | 12/2009 | Burek | G02B 6/4457 |
| | | | 385/134 |
| 8,042,699 B2 * | 10/2011 | Leichter | G02B 6/4457 |
| | | | 211/26.2 |
| 8,307,996 B2 | 11/2012 | Taylor | |
| 8,931,742 B2 | 1/2015 | Gong et al. | |
| 9,459,425 B2 * | 10/2016 | Smith | G02B 6/4457 |
| 9,581,782 B2 * | 2/2017 | Abby | G02B 6/4457 |
| 9,634,472 B2 * | 4/2017 | Kaml | F16M 13/022 |
| 9,638,882 B2 * | 5/2017 | Smith | G02B 6/4457 |
| 10,076,054 B2 * | 9/2018 | Goergen | H05K 7/1491 |
| 2004/0011547 A1 * | 1/2004 | Wright | H04Q 1/064 |
| | | | 174/50 |
| 2011/0120964 A1 | 5/2011 | Walker et al. | |
| 2016/0330859 A1 | 11/2016 | Chen et al. | |

* cited by examiner

CABLE GUIDE 325

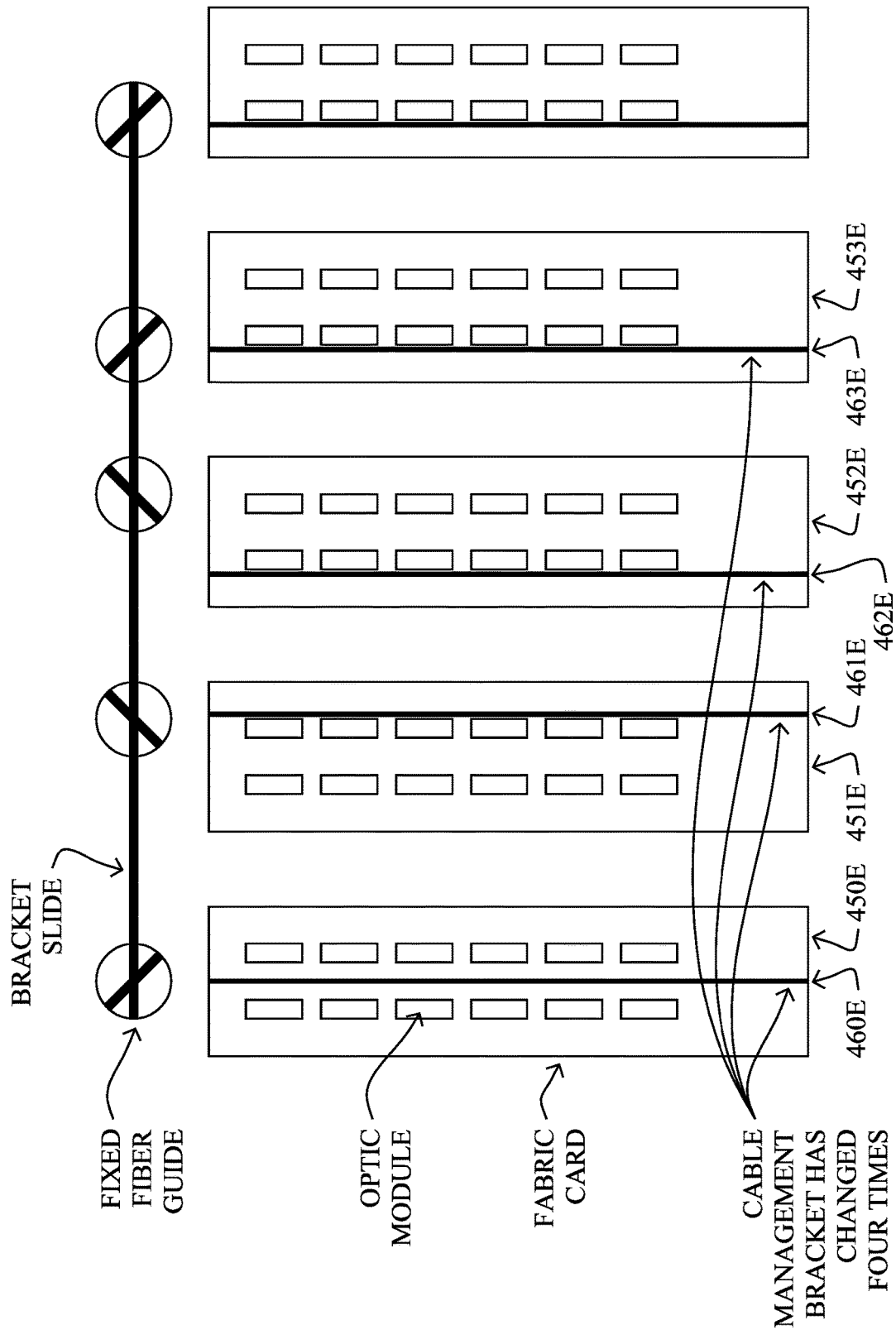

ADJUSTABLE CABLE MANAGEMENT SLIDE AND DIRECTION CONTROL FOR OPTIMIZED ROUTING

CROSS-REFERENCE TO RELATED APPLICATION

This application claims the benefit of U.S. Provisional Application No. 62/481,357, entitled ADJUSTABLE CABLE MANAGEMENT SLIDE AND DIRECTION CONTROL FOR OPTIMIZED ROUTING, by Gupta et al., filed Apr. 4, 2017, the disclosure of which is incorporated herein by reference.

TECHNICAL FIELD

The present disclosure relates generally to computer networks, and, more particularly, to an adjustable cable management slide and direction control for optimized cable routing.

BACKGROUND

Many computing and other networking devices use a card-based configuration in which a chassis/housing can hold a plurality of removable card modules. For example, the housing of a particular carrier router may include twenty four slots for fabric cards. These cards may be wired using, e.g., optical array cables (e.g., fabric cables), electric cables, or the like. Depending on the configuration of the system and the number of cards, this can lead to the cabling taking up significant space and making cable management challenging.

BRIEF DESCRIPTION OF THE DRAWINGS

The embodiments herein may be better understood by referring to the following description in conjunction with the accompanying drawings in which like reference numerals indicate identically or functionally similar elements, of which:

FIGS. 4A-4E illustrate various approaches to cable management in a chassis;

DESCRIPTION OF EXAMPLE EMBODIMENTS

Overview

According to one or more embodiments of the disclosure, an apparatus is disclosed comprising a cable management bracket and a cable guide connector configured to engage a slot of a networking chassis having a length extending along a first axis. The cable guide connector comprises a center section configured to slide within the slot along the first axis and having an aperture configured to receive a retainer to secure the cable guide connector by compression at a selected position along the length of the slot. The cable guide connector further comprises a first flange extending from a first end of the center section, the first flange configured to be inserted through the slot; and a second flange extending from a second end of the center section opposite that of the first end of the center section, the second flange defining a plurality of apertures configured to engage a protrusion of the cable management bracket and define a plurality of selectable angles at which the cable management bracket can be positioned relative to a second axis that is perpendicular to the first axis through which the slot extends.

According to one or more other embodiments of the disclosure, an apparatus is disclosed comprising a cable guide connector configured to engage a slot of a networking chassis having a length extending along a first axis and a cable management bracket configured to engage the cable guide connector. The cable management bracket comprises an elongated section configured to support one or more cables in the networking chassis; a first end having a protrusion configured to engage one of a plurality of apertures in the cable guide connector and define a plurality of selectable angles at which the cable management bracket can be positioned relative to a second axis that is perpendicular to the first axis through which the slot extends; and a second end configured to enable rotation of the cable management bracket about the second axis.

Description

Various computing and networking devices use a card-based configuration in which a multi-slot networking chassis/rack houses a plurality of cards. The cards may be interconnected via cabling (e.g., optical, electrical, etc.) within the chassis, allowing the cards to communicate with one another and/or other computing devices. For example, in a multi-shelf system, an ingress line card may be wired to an egress line card via a fabric plane.

Figure 1:
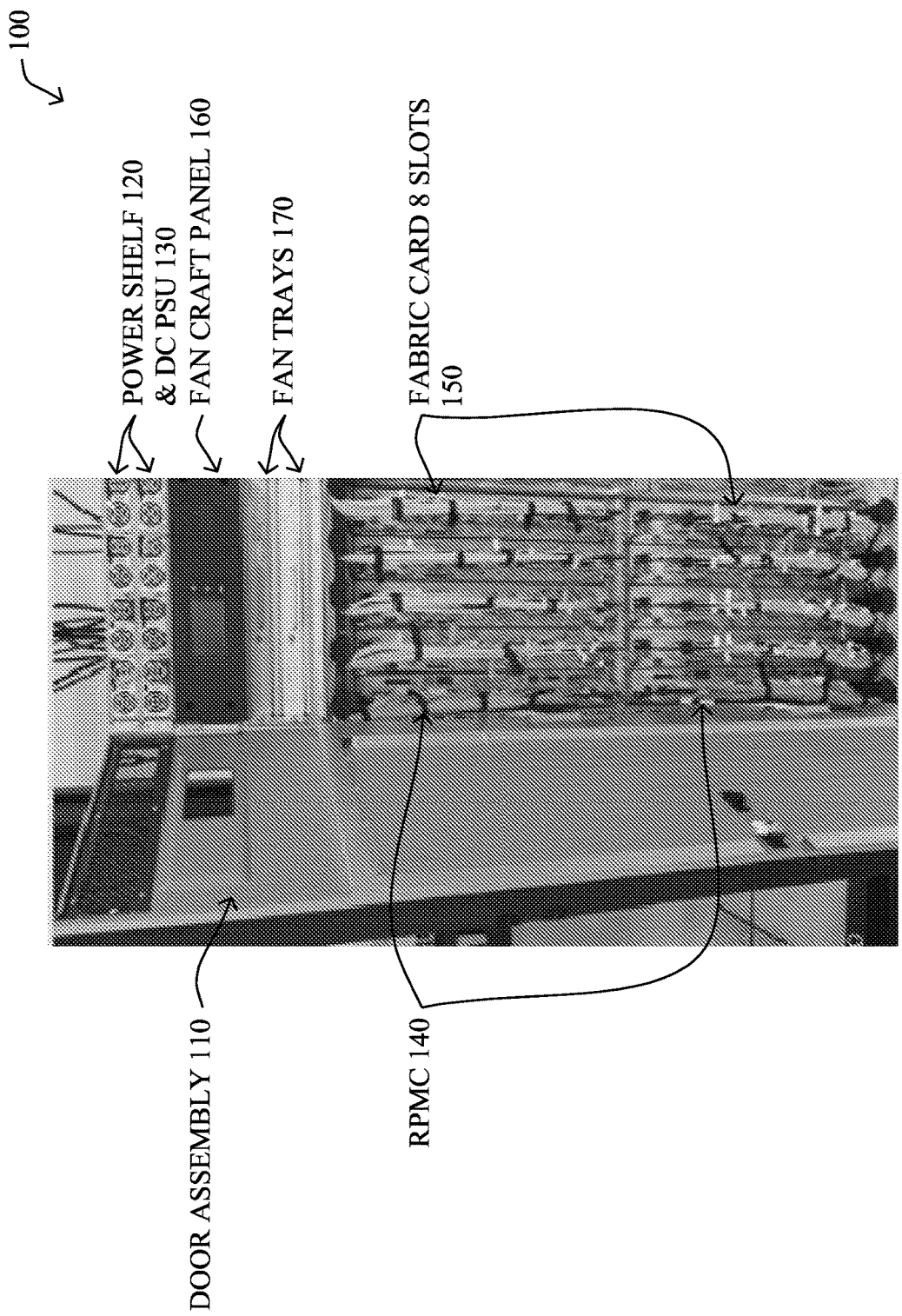
FIG. 1 illustrates an example chassis with multiple cards.

An example multi-slot networking chassis is illustrated in FIG. 1. As shown, the chassis may include door assembly 110 that allows the user access to the internal chamber of the chassis. Within the internal chamber may be housed power shelf 120 and direct current (DC) power supply unit (PSU) 130 that powers any number of cards. Such cards may include, for example, routing control/monitoring policing (RCMP) cards 140 and/or fabric cards 150. Also housed within the internal chamber of the chassis may be fan craft panel 160 and fan tray(s) 170 that provide cooling within the internal chamber of the chassis.

Figure 2A:
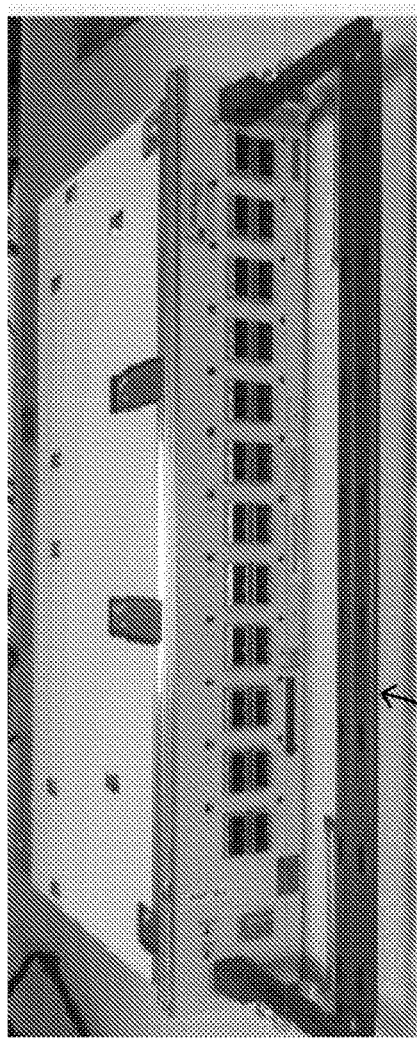
FIGS. 2A-2B illustrate examples of different management brackets for cards.
Figure 2B:
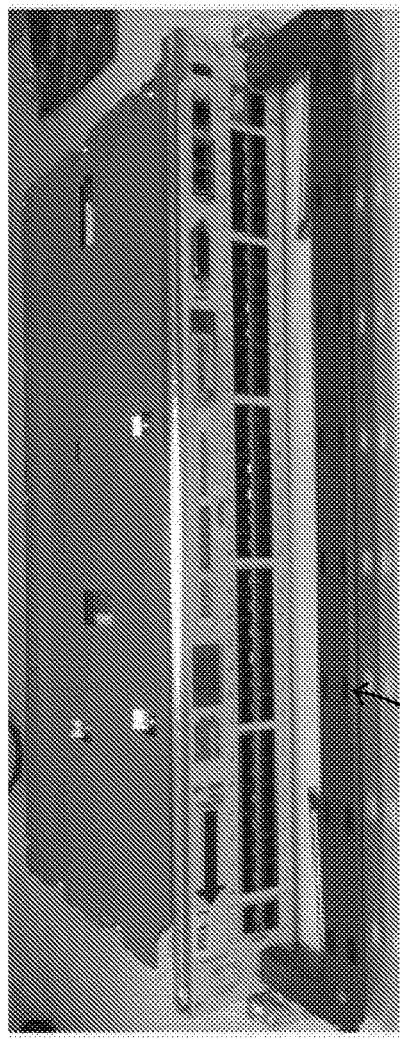

Each card within the chassis may wired using electrical and/or optical (e.g., fiber) cabling, as shown. Typically, such cards include a management bracket that is used to route the cabling in a set direction. For example, FIG. 2A illustrates an example fabric card and management bracket 215A, while FIG. 2B illustrates an example line/RPMC card with management bracket 215B. As would be appreciated, the location of the management brackets for cabling of cards may differ between card types, as well as among different generations of a given type of card. For example, as shown in FIG. 2A, management bracket 215A may be substantially central with respect to the face of the card or, as shown in FIG. 2B, management bracket 215B may be located closer to or positioned along one of the edges of the face of the card.

Figure 3C:
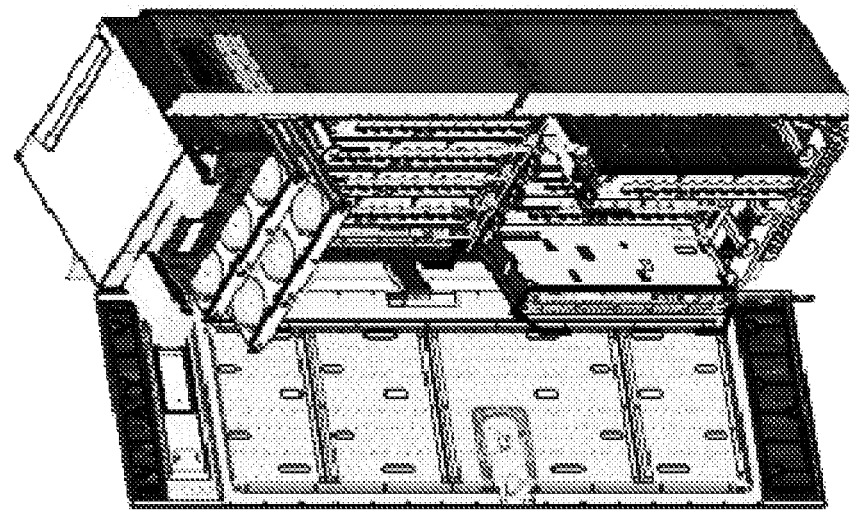
FIGS. 3A-3E illustrate an example chassis in more detail.
Figure 3B:
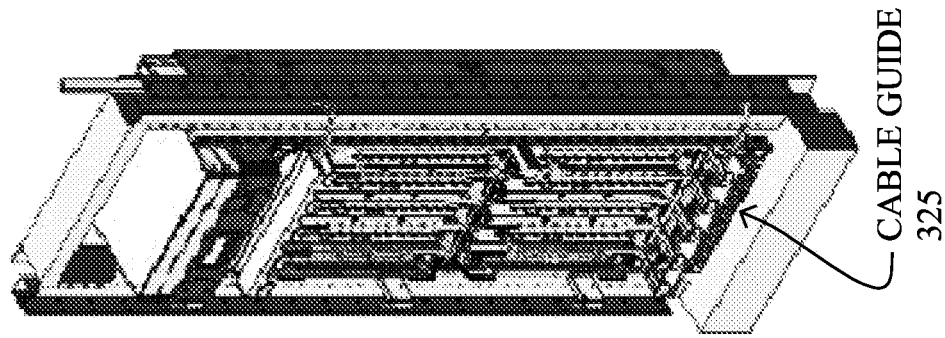
Figure 3A:
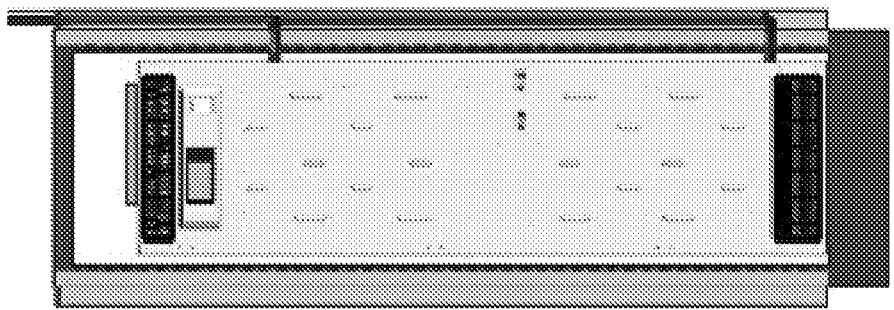
Figure 3E:
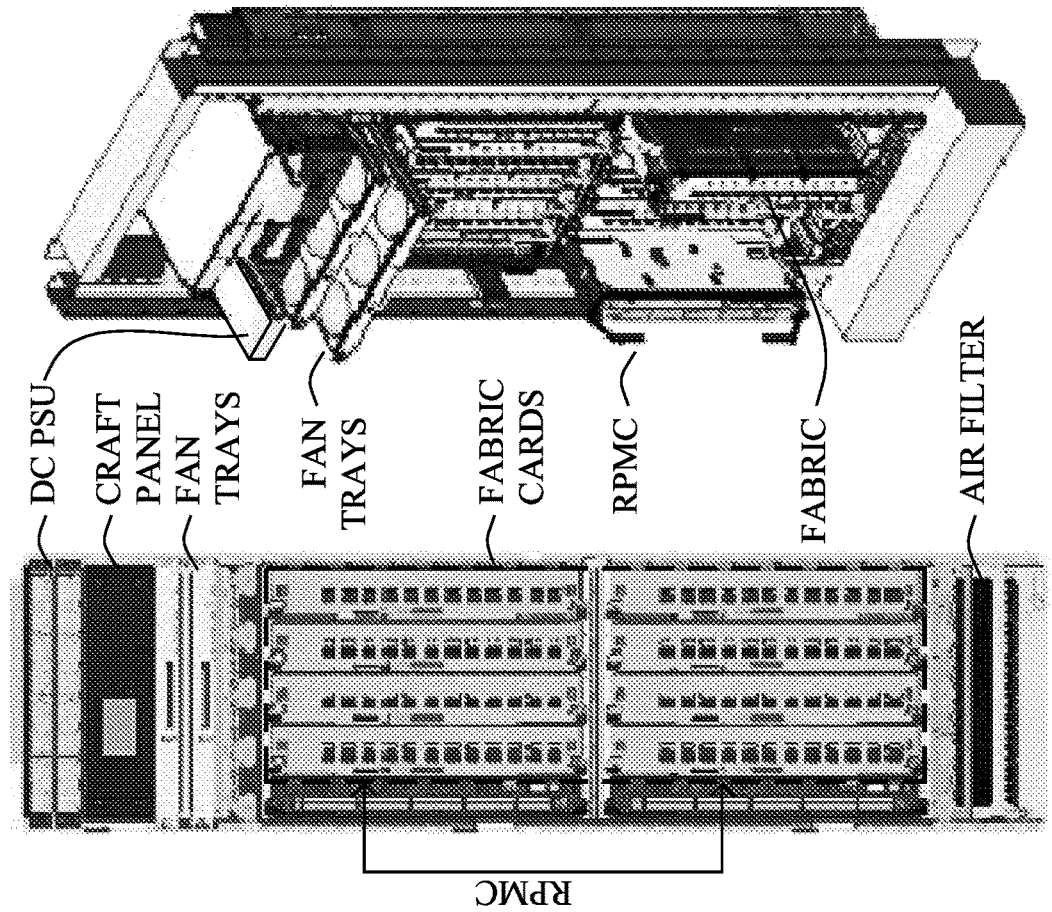
Figure 3D:
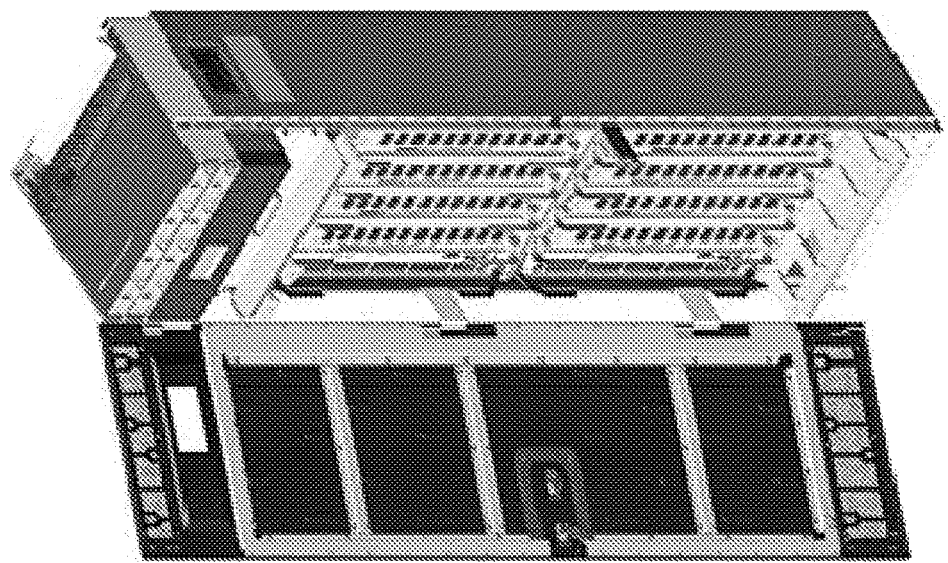

As shown in greater detail in FIGS. 3A-3E, which are different views of a particular networking chassis, the chassis housing the cards may also include cable guide 325, specifically shown in FIG. 3B. During installation and maintenance, the cabling for the various cards may be routed towards the cable guide, which, in turn, may direct the cabling towards one of the sides of the chassis for egress. For a typical cable guide, the routing direction for the cabling is static in nature.

As noted above, however, with increasing port density on networking products, managing the large number of cables connecting them can be cumbersome. Notably, the majority of service providers have very stringent cable and optical fiber management guidelines to have directional exit towards a particular direction of a vertical rack post/chassis. Any cable management solution offering directional exit of the cables must also maintain the required bend radius and not allow the mixing of electrical and optical cables. Further, the location of the management bracket on the front of a line card or fabric card may change from design to design or version to version of the same design, thus complicating cable management even further. This is highlighted in FIG. 4A.

Figure 4A:
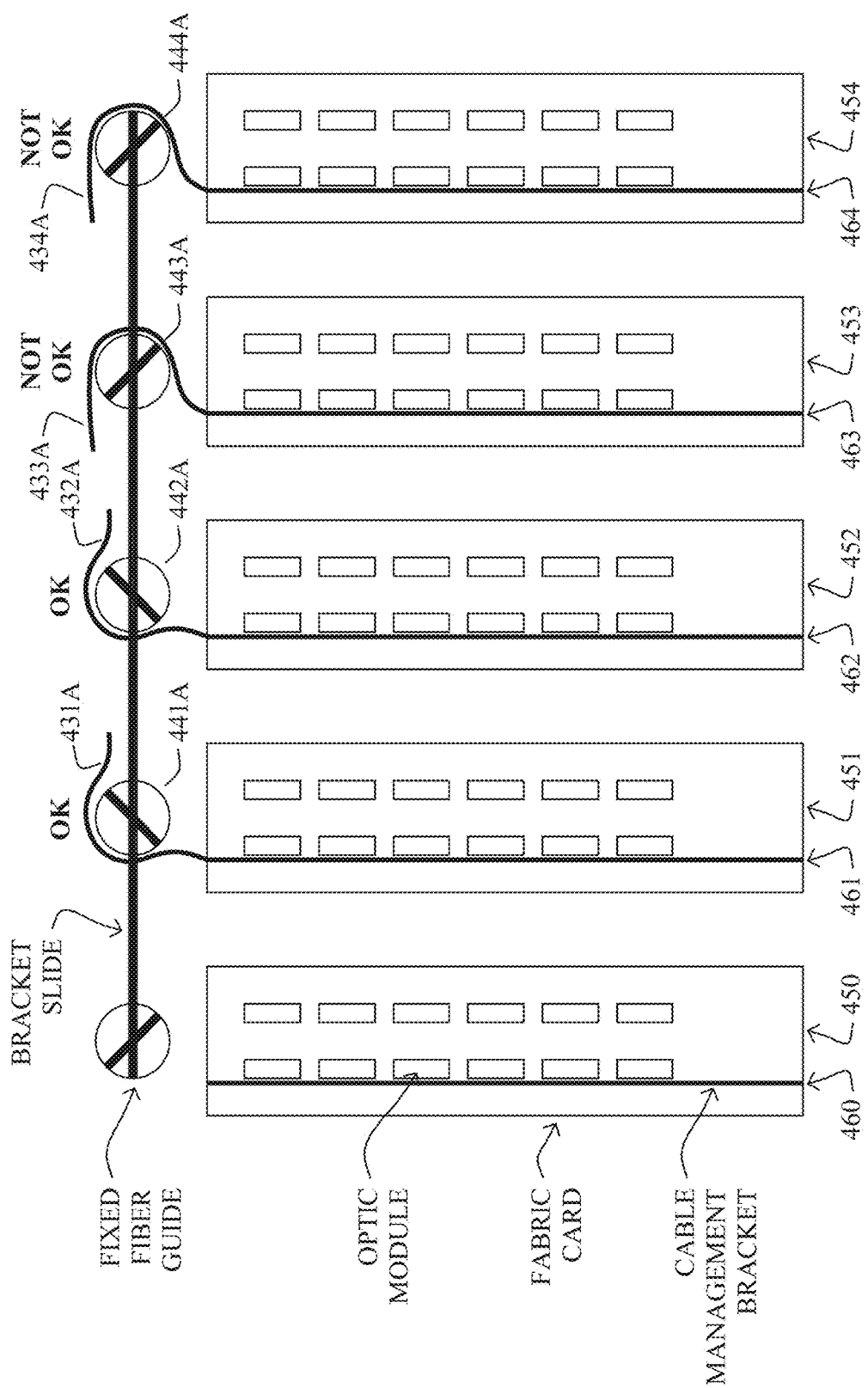
Figure 4B:
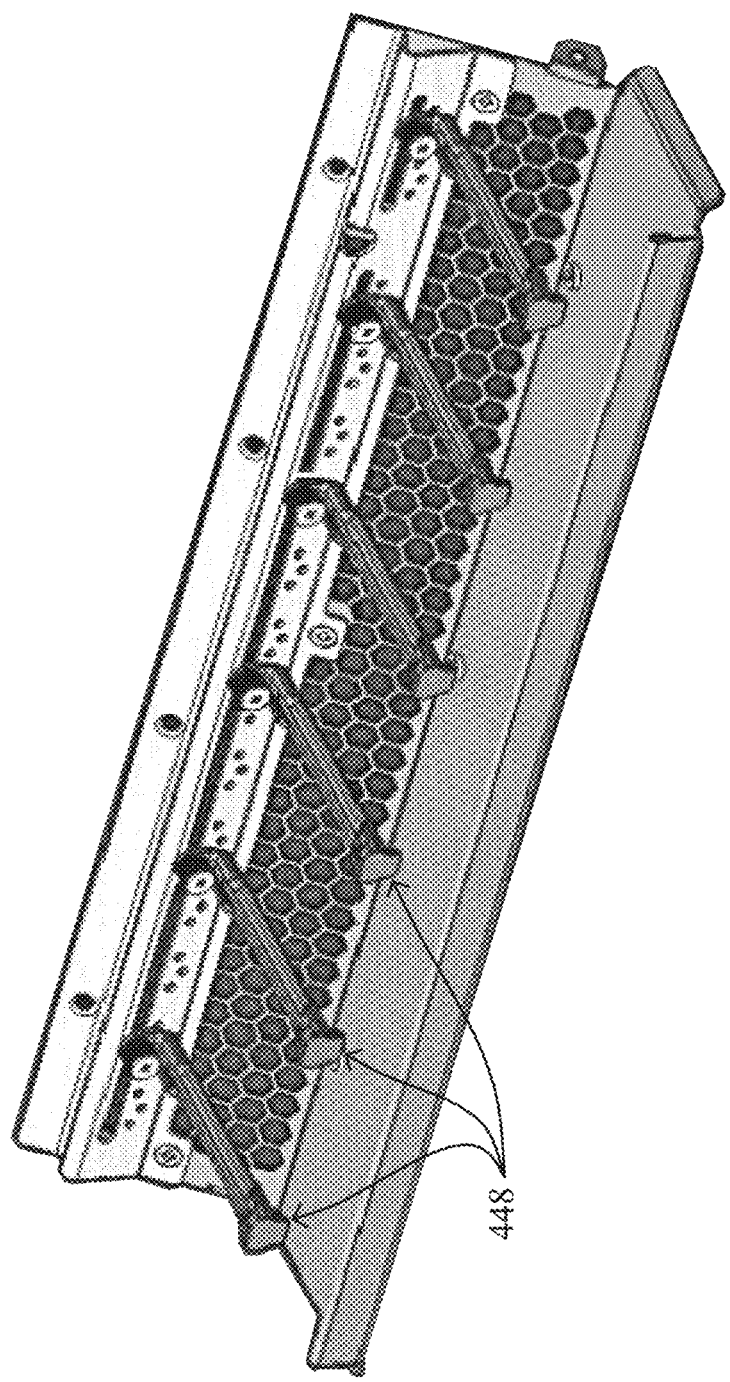
Figure 4C:

In some embodiments, a cable guide having adjustable brackets 448 may be used, as shown in FIG. 4B, allowing for the selected direction for the routing of the cabling. However, once the bracket angle has been set, the bracket position is not easily adjusted. Furthermore, as shown particularly in FIG. 4C, by only allowing for the brackets to support different angular positions (illustrated, for example, by cable guides 435), the relative position of the cable management brackets may misalign with the cable exit from the module. In a small form factor chassis (such as shown in FIG. 4C), this misalignment could cause cables to occupy the space in front of adjacent device modules, which may interfere during extraction/insertion of the device module (note, for example, the interference created by cable guides 437 with card ejector 445).

Adjustable Cable Management Slide and Direction Control for Optimized Routing

The techniques herein provide an adjustable cable management solution that offers flexibility when managing a large quantity of cables in a networking chassis. In some embodiments, the techniques herein afford cable management structures that provide different rotational orientations and further also provide sliding adjustment control to be able to more effectively align with the cable exit positions on a card management bracket.

For example, as shown in FIG. 4A, device modules 450-454 each include a management bracket (460-464) for cables 431A-434A, which are directed to an egress via cable guides 441A-444A. As shown, however, cable guides 443A and 444A do not provide an adequate bend radius for cables 433A and 434A respectively, due to the positioning of the corresponding cable guide relative to the position of the management brackets and the required direction of egress.

Figure 4D:
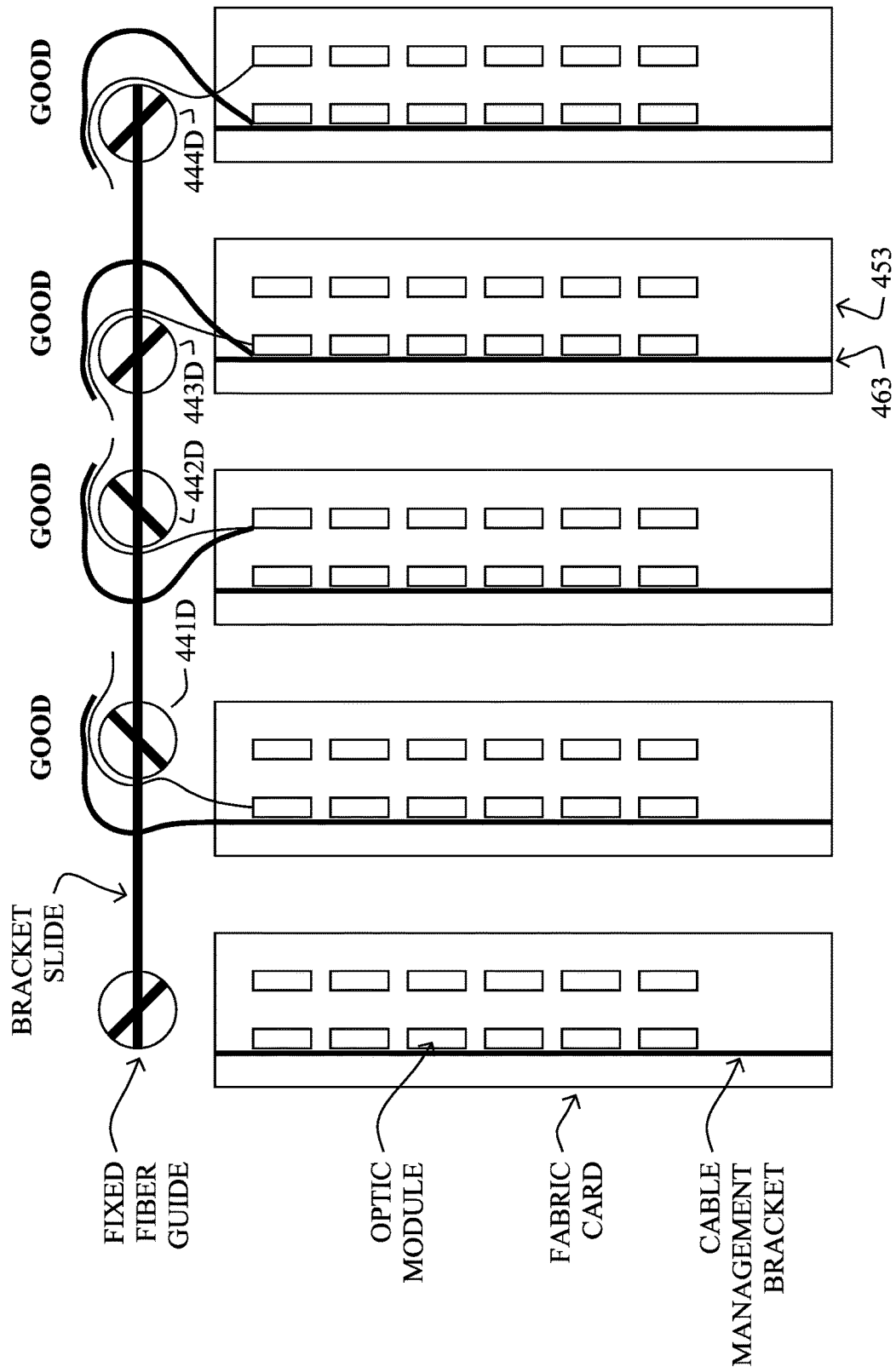

In various embodiments of the present disclosure, a cable guide is described that provides both rotational and sliding features to enable proper routing of cables relative to management brackets of device modules in a modular networking chassis, in order to manage the cable/fibers more effectively. Such adjustment helps in a very clean cable management solution without interfering with any adjacent device modules. For example, as shown in FIG. 4D, cable guides 441D-444D, in some embodiments, may be slid, such as along a slot in the wall of the networking chassis or in a plate or tray positioned within the chassis, in order to provide an improved cable arrangement (for example, compare cable 433A prior to slide with cable 433D after slide). The direction/position of the cable guide may be readily changed and adjusted as often as needed, as shown in FIG. 4E, such as when replacement device modules (e.g., 450E-453E) have different orientations of management brackets (e.g., 460E-463E) than the original device module (e.g., 450A-453A having management brackets 460A-463A shown in FIG. 4A) or if the egress of various cables needs to be changed.

Specifically, according to one or more embodiments of the disclosure as described in detail below, an apparatus is disclosed comprising a cable management bracket and a cable guide connector configured to engage a slot of a networking chassis having a length extending along a first axis. The cable guide connector comprises a center section configured to slide within the slot along the first axis and having an aperture configured to receive a retainer to secure the cable guide connector by compression at a selected position along the length of the slot. The cable guide connector further comprises a first flange extending from a first end of the center section, the first flange configured to be inserted through the slot; and a second flange extending from a second end of the center section opposite that of the first end of the center section, the second flange defining a plurality of apertures configured to engage a protrusion of the cable management bracket and define a plurality of selectable angles at which the cable management bracket can be positioned relative to a second axis that is perpendicular to the first axis through which the slot extends.

According to one or more other embodiments of the disclosure, an apparatus is disclosed comprising a cable guide connector configured to engage a slot of a networking chassis having a length extending along a first axis and a cable management bracket configured to engage the cable guide connector. The cable management bracket comprises an elongated section configured to support one or more cables in the networking chassis; a first end having a protrusion configured to engage one of a plurality of apertures in the cable guide connector and define a plurality of selectable angles at which the cable management bracket can be positioned relative to a second axis that is perpendicular to the first axis through which the slot extends; and a second end configured to enable rotation of the cable management bracket about the second axis.

Operationally, FIG. 5 illustrates an embodiment of an adjustable cable management solution to organize and arrange cables/fibers from device modules within a networking chassis comprising a cable guide configured to slide within a slot of a modular networking chassis. In particular, cable guide 500 may include cable management bracket 510 and cable guide connector 520 (sometimes herein referred to as a "magic nut") that, in some embodiments, may be coupled by a retainer, such as thumb screw 525, and attached to sheet metal plate 530 (e.g., a wall of a networking chassis/rack) by insertion into slot 540, such as through key-hole opening 545. The cable guide connector/magic nut is configured to allow different rotational and sliding orientations for the cable management bracket. In particular, cable management bracket 510 may be configured to rotate around axis X (parallel with the cable management bracket), and cable guide connector 520 may be configured to slide within slot 540 extending along axis Y. In some embodiments, axis X and Y are orthogonal, although other angles may be used depending, for example, on the arrangement of device modules in the chassis and the available space for cabling.

Figure 6:
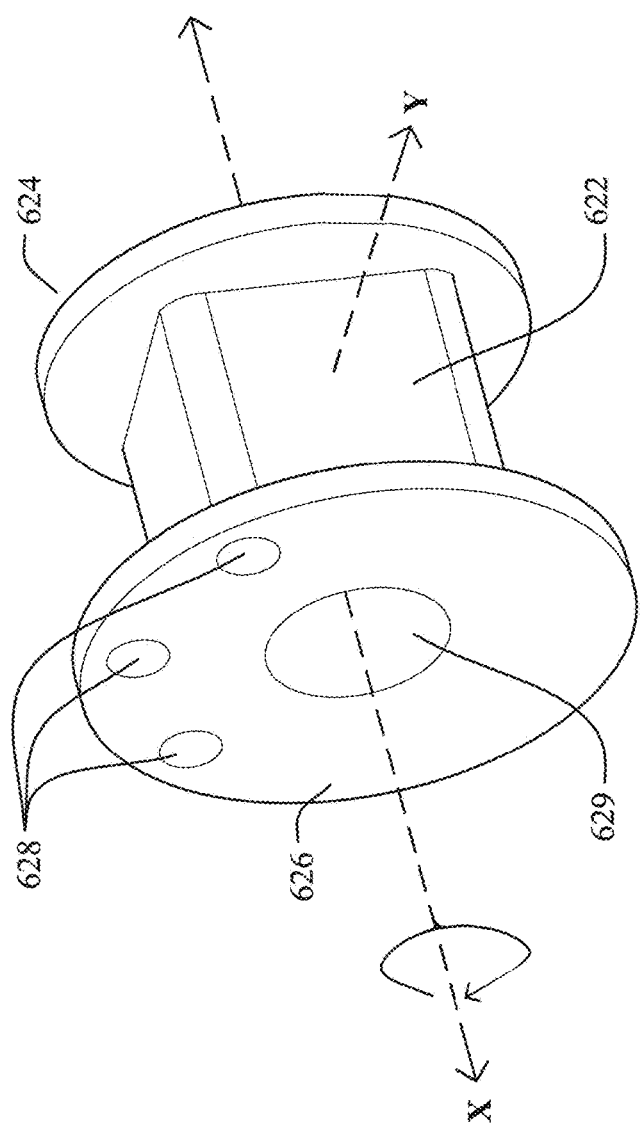
FIG. 6 illustrates an example cable guide connector.

An embodiment of the cable guide connector/magic nut is shown in more detail in FIG. 6. In particular, as shown, cable guide connector 520 is a mechanical part including center section 622 with first flange 624 (also sometimes herein referred to as the rear flange) and second flange 626 (also sometimes herein referred to as the front flange) at opposing ends of the center section. The center section is configured to slide within the slot of the networking chassis, such as along axis Y, and first flange 624 is configured to be inserted into the slot.

Figure 5A:
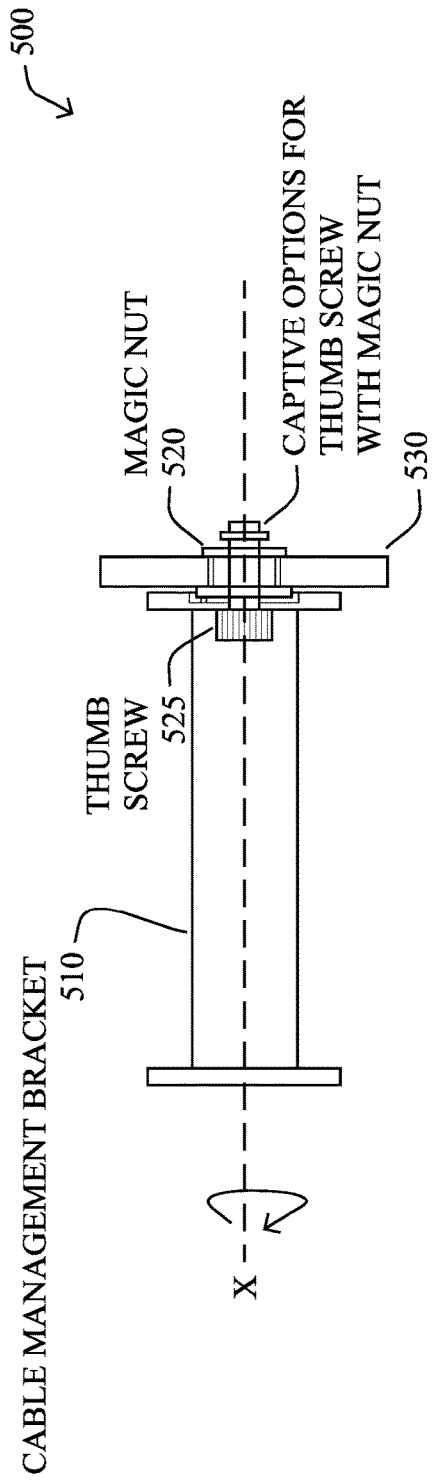
FIGS. 5A-5B illustrate an example adjustable cable management solution.

The center section and flanges may have a variety of different sizes and cross-sectional shapes depending, for example, on the width and shape of the slot into which it is to be inserted. In some embodiments, center section 622 may have a cross-sectional shape that prevents the magic nut from rotating within the slot. In the specific example shown in FIG. 6, the center section may have a square cross-sectional shape that is sized to allow the connector to slide within a linear slot but not be capable of turning inside the slot. The depth of the square section may be similar to the chassis slot thickness to avoid any unnecessary movement during bracket adjustment (as can be seen in FIG. 5A). First flange 624 may have a size corresponding to the key-hole entry of the slot on the chassis (e.g., key-hole opening 545), such as a circular shape. Second flange 626 may be relatively larger than the first flange and may have a different or similar shape. In this way, the magic nut may only be capable of insertion into the chassis slot in one direction by the first flange. This would also guarantee that the magic nut will never fall off behind the chassis slot. The center section may further include an aperture, such as threaded opening 629, into which a retainer (e.g., thumb screw 525) may be inserted in order to secure the magic nut to the networking chassis.

As shown, second flange 626 may include one or more apertures 628 defining selectable alignment angles at which the cable management bracket may be positioned, such as by rotation around axis X. Any number of apertures may be used, and the angles may be varied accordingly, such as from approximately 30°-45°. For example, as specifically shown in FIG. 6, three apertures 628 (e.g. alignment holes) may be included on or through the second flange in order to provide three directional positions/angles for the cable management bracket, separated by intervals of 45°.

Figure 7:
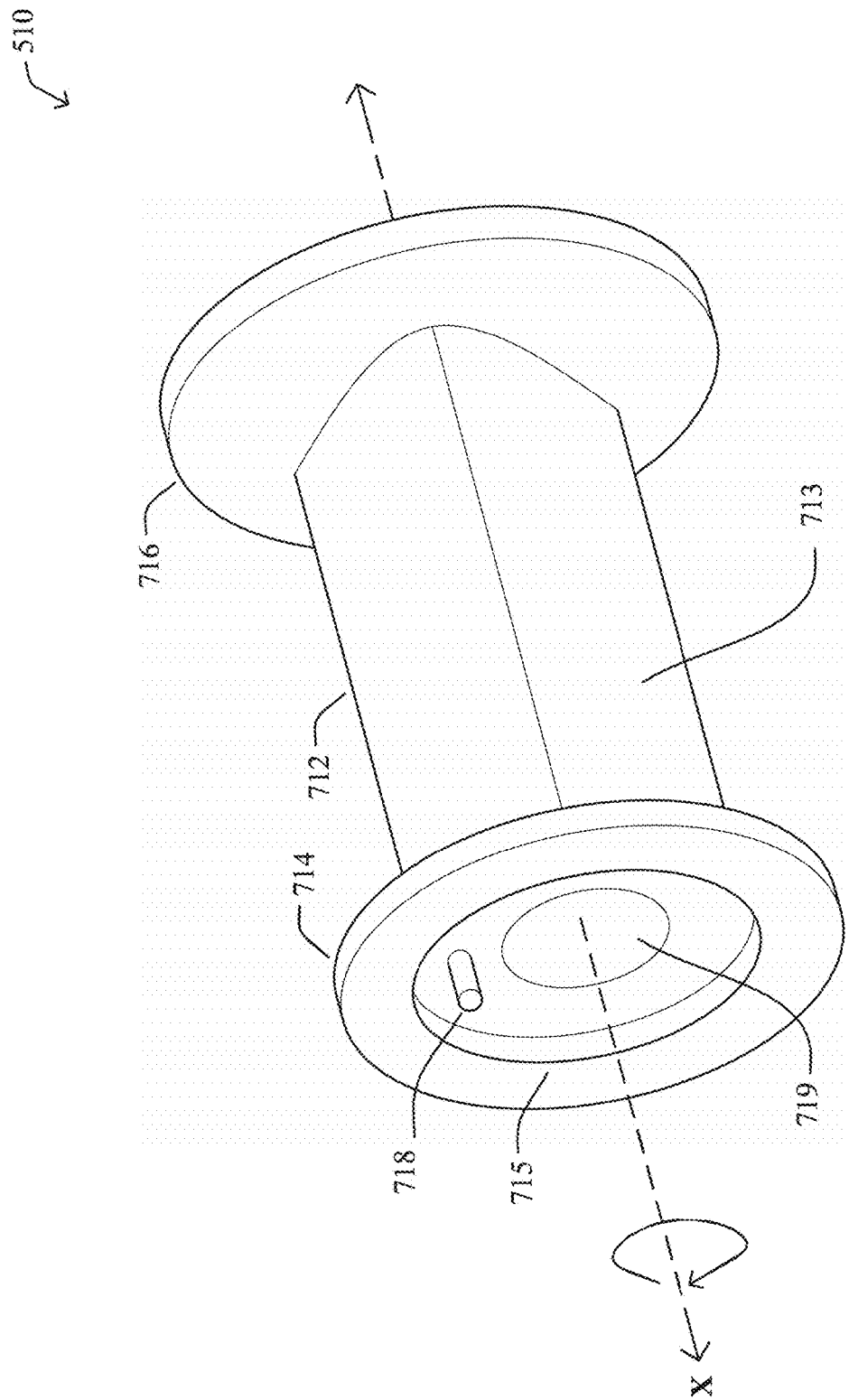
FIG. 7 illustrates an example cable management bracket.

An embodiment of the cable management bracket is shown in greater detail in FIG. 7. In particular, cable management bracket 510 comprises elongated section 712 having a first end 714 (sometimes herein referred to as the rear flange), which is configured to engage with the cable guide connector, and opposing second end 716, which is configured to enable rotation of the bracket. The elongated section may support one or more cables/fibers in the networking chassis. As such, the dimensions of the elongated section of the bracket may be selected based on the volume of cables/fibers to be managed and also on the available space in the chassis. For example, in some embodiments, the elongated section may have one or more curved outer surfaces (e.g., curved surface 713) around which cables can be smoothly routed without exceeding the recommended cable bend radius.

In some embodiments, the first end of the cable management bracket is configured to receive the cable guide connector, described in more detail above. In particular, as shown in FIG. 7, the rear flange of the bracket (e.g., first end 714) may include cutout section 715 into which the front flange of the magic nut (e.g. second flange 626) may be inserted. A gap may be maintained between these two parts in fully-closed position so that they can be tightened together against the networking chassis.

First end 714 may further comprise a protrusion configured to engage with one of the apertures in the cable guide connector, and the shape and size of the protrusion can vary with the shape and size of the apertures. For example, as shown in FIG. 7, in some embodiments, first end 714 may include alignment pin 718 that is sized and shaped to fit in one of the three apertures 628 of cable guide connector 520 in order to achieve the desired orientation of the bracket for direction exit of the cables.

Second end 716 may be configured to rotate the cable management bracket, such as to enable the protrusion to align with the apertures of the cable guide connector. For example, a user may grasp second end 716 and rotate the bracket around axis X until alignment pin 718 inserts into one of the apertures of the magic nut. In this way, an angle may be selected at which the cable management bracket can be oriented in order to provide proper positioning of cables in the networking chassis.

As discussed above, the cable management bracket and magic nut may be coupled together, as well as to the networking chassis, with a retainer, such as thumb screw 525. Second end 716 may comprise opening 719, which may be similar in size to threaded opening 629 of the magic nut, to receive the thumb screw. In some embodiments, the thumb screw may include a captive feature (such as flaring or a split ring) so that the magic nut does not fall off and, in particular, so the magic nut remains within the slot (as shown, for example, in FIG. 5A). In this way, the cable guide, comprising the cable management bracket and the cable guide connector, may be pre-assembled separately from the networking chassis. A user may thereby insert the rear flange of the magic nut portion of the assembled cable guide through a key-hole of the slot in the networking chassis, align the bracket to a selected angle by rotation and sliding along the length of the slot, and tighten the thumb screw to secure the assembly together and to the chassis.

Figure 8:
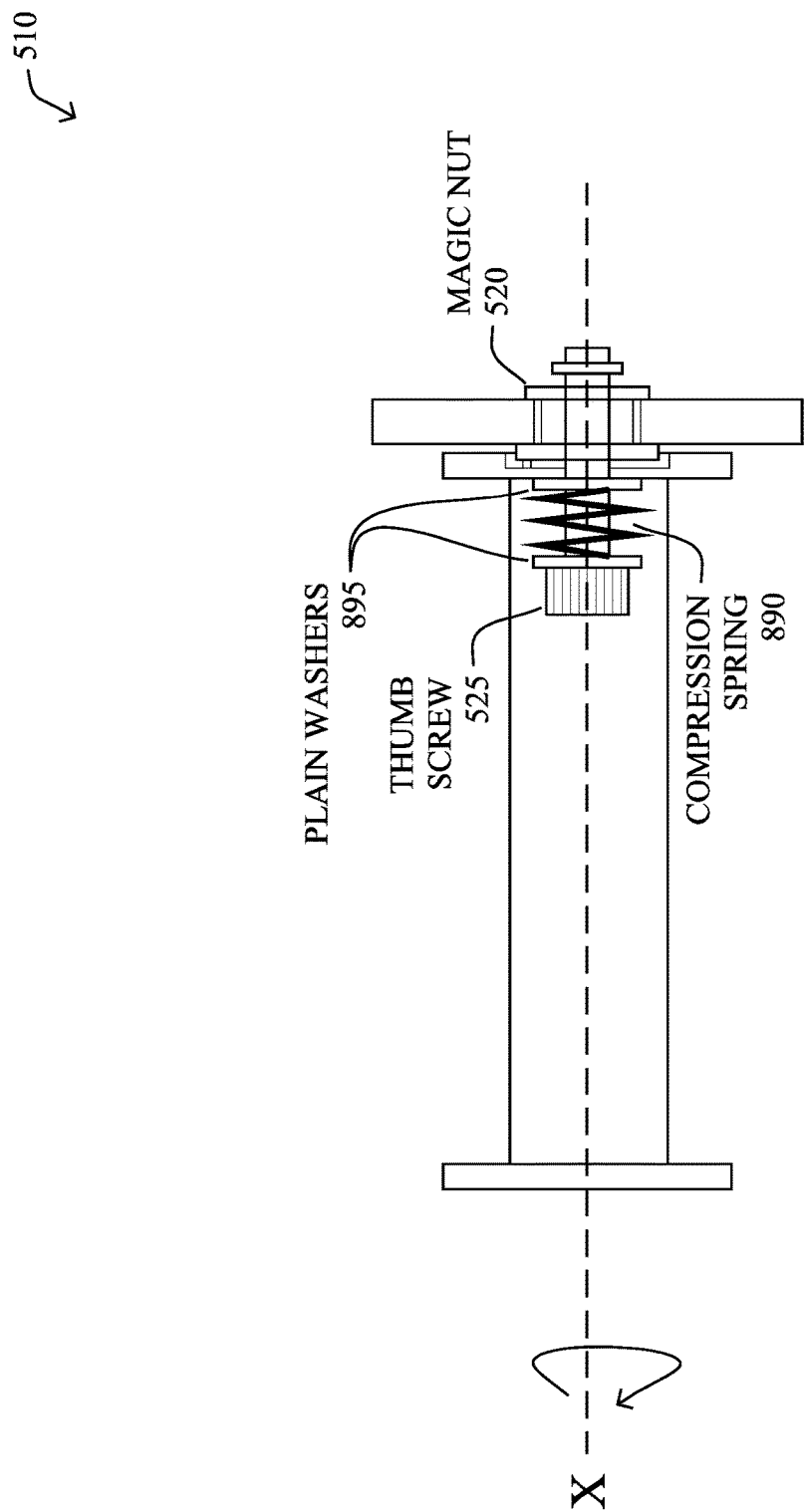
FIG. 8 illustrates an example cable guide.

In another embodiment, the adjustable cable guide may include a spring loaded retainer. For example, as shown in FIG. 8, thumb screw 525 may include compression spring 890 between washers 895. In this way, adjustments may be made to the bracket position, such as to select a different bracket angle, by pulling the bracket back against the spring (e.g., along axis X). The plain washers at both ends of the spring may provide for a smooth rotation of the bracket while the spring is compressed.

Figure 5B:
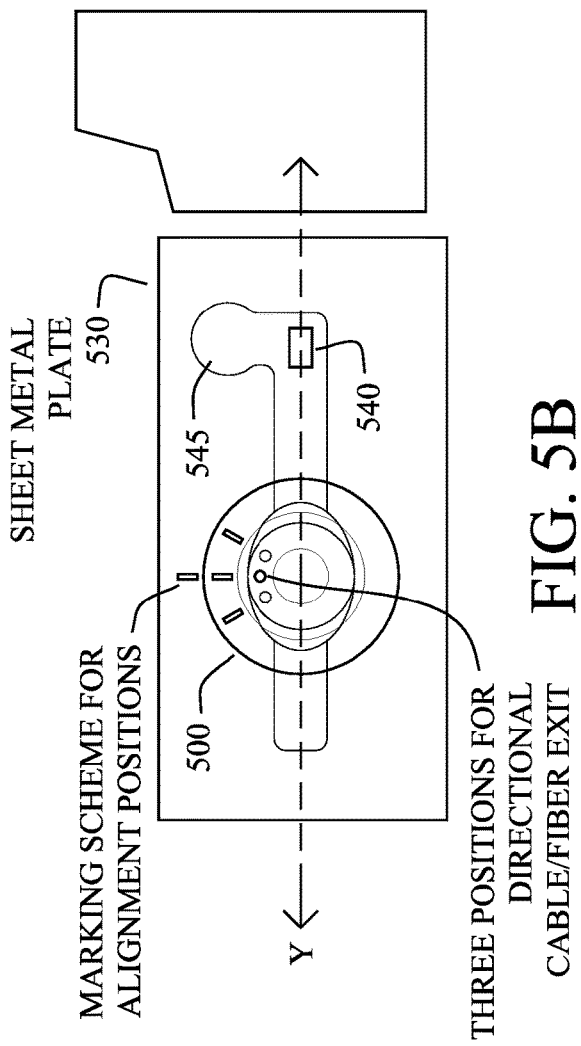
Figure 9:
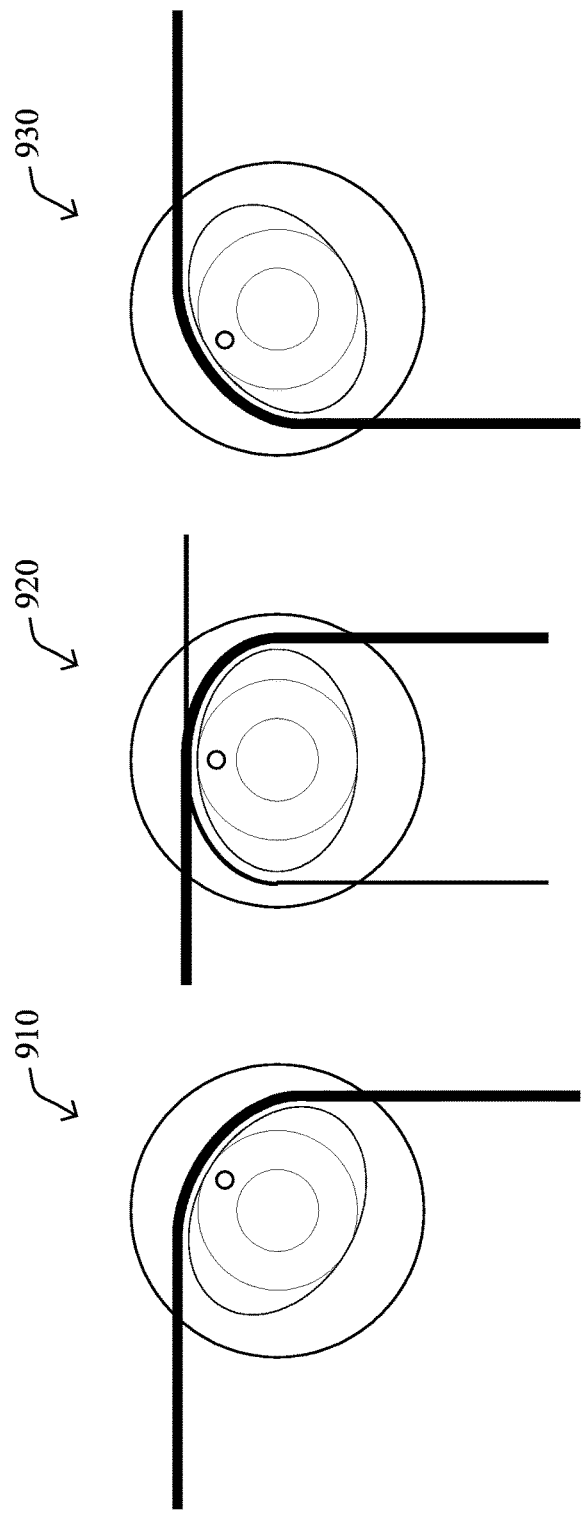
FIG. 9 illustrates an example directional cable management.

In some embodiments, as shown in FIG. 9, three different angular positions of the cable management bracket may be selected to provide effective directional control for the egress of the cables from the various device modules. While a variety of different positions and angles are possible, such as angles with intervals of approximately 30°-45°, a specific angle interval of 45° is shown. Based on the specific positioning of the cable management bracket shown, the cables may be routed for egress either towards the left side of the chassis (e.g., position 910) or to the right side of the chassis (e.g., position 930). In addition, the normal position (e.g., position 920) may also allow two different cables to be routed in each direction using the same cable management bracket, although, depending on the curvature of the outer surface of the bracket, the transition of the cable on the bracket may be less smooth. In addition a marking scheme may be included, such as on the chassis and/or on the cable management bracket (such as on first end 714 and/or on second end 716) to assist a user to set the selected orientation of the bracket based on the required exit direction of the cables. Specific examples are shown in FIG. 5B and FIG. 9.

Figure 10:
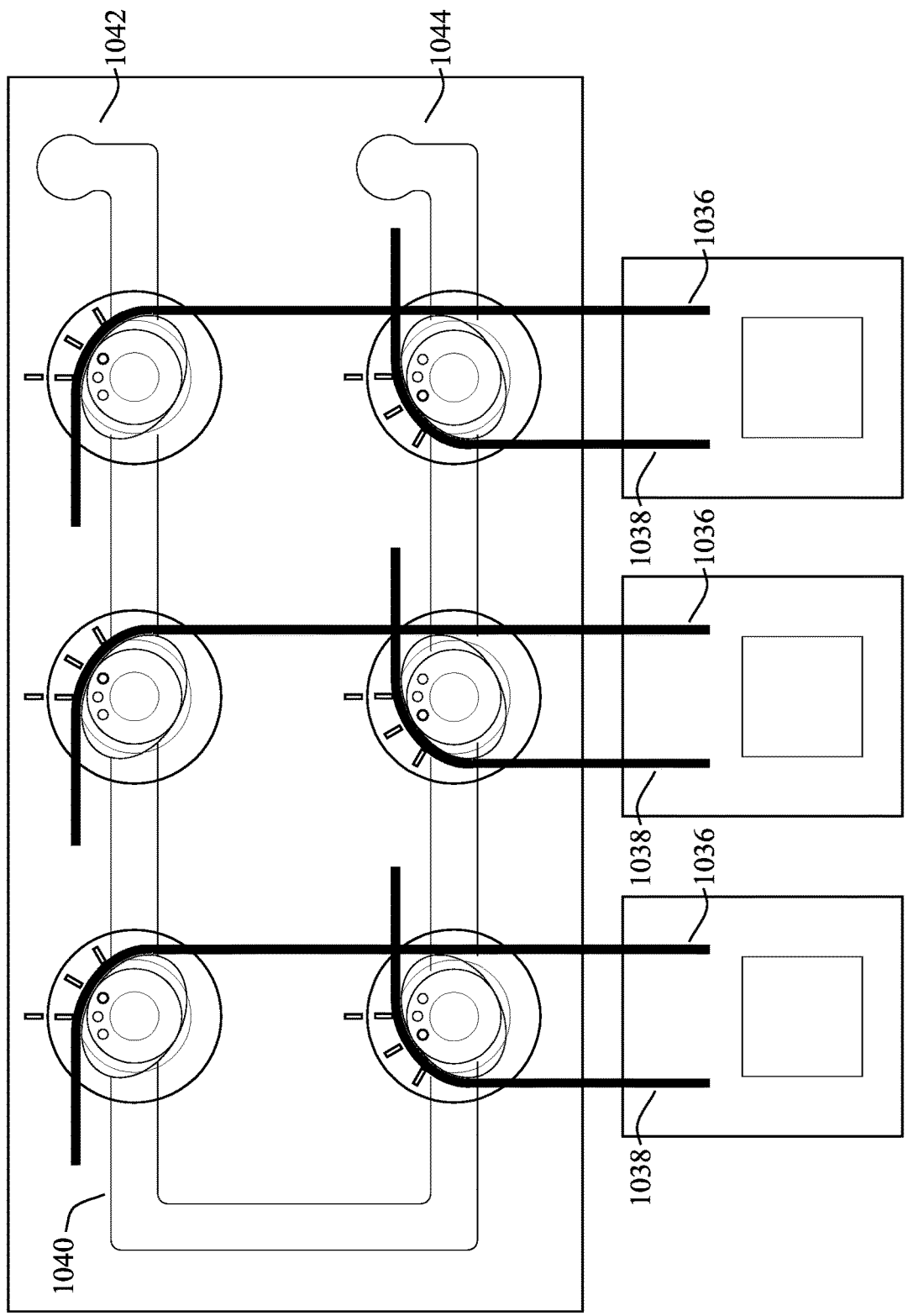
FIG. 10 illustrates an example multiple directional cable management.

Similarly, FIG. 10 illustrates multiple cable guides positioned along serpentine slot 1040 having an upper and lower section, with cable guides along the upper section (e.g., cable guides 1042) having a selected angle directing cables for egress to the left and with cable guides along the lower section (e.g., cable guides 1044) having a selected angle directing cables for egress to the right. This specific arrangement may provide additional flexibility for a user needing to support a large number of cables in a tight space within a networking chassis. Thus, a high density of cables may be managed through additional brackets, and different types of cables (e.g. cables 1036 and cables 1038, which may be electrical cables or optical cables respectively) may be separated out and, if desired, routed in different directions by cable type, as shown in FIG. 10.

Figure 11:
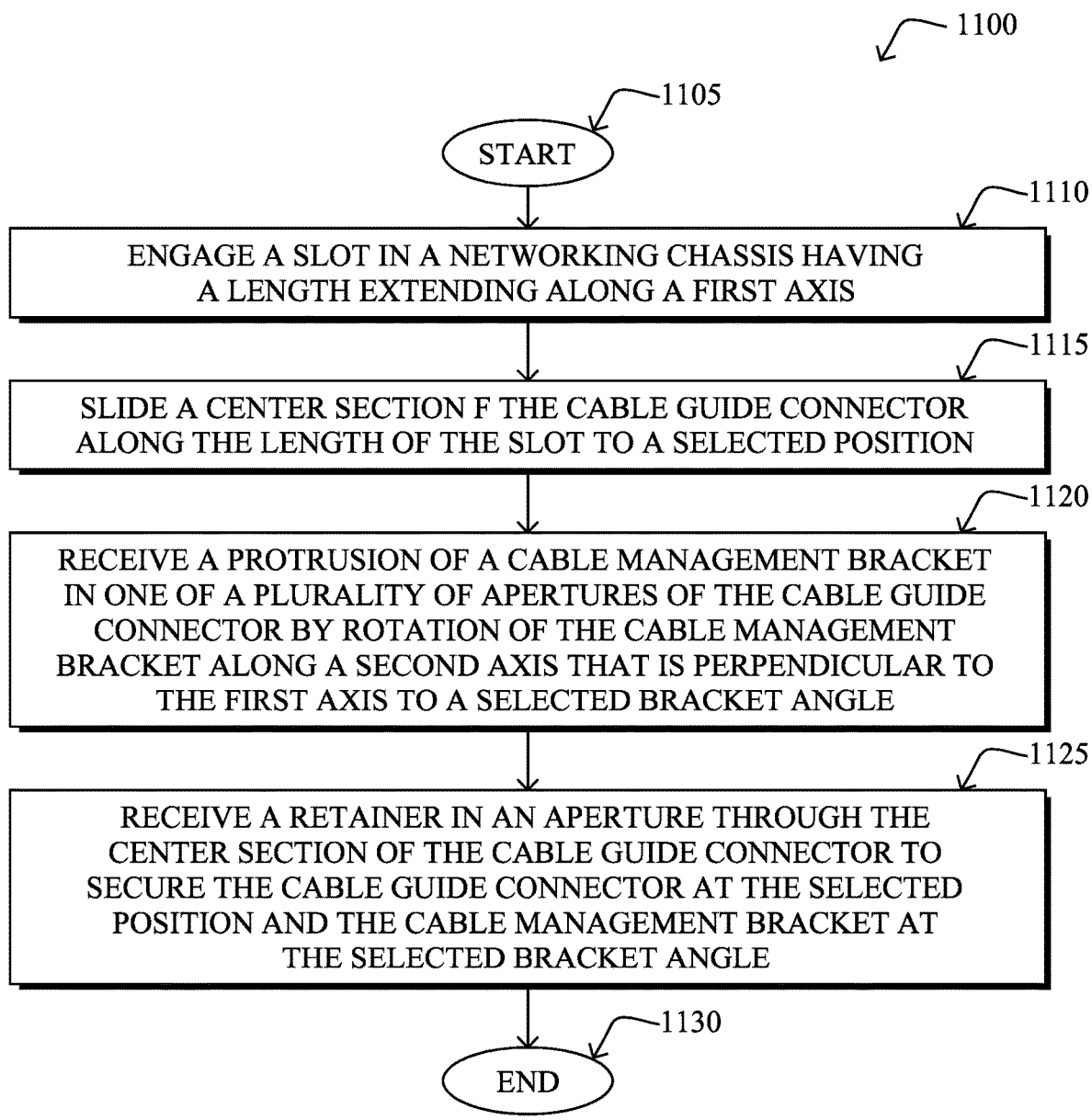
FIG. 11 illustrates a simplified procedure for cable management.

FIG. 11 illustrates an example simplified procedure for providing adjustable optimized cable routing, in accordance with one or more embodiments described herein. Procedure 1100 may start at step 1105 and continue to step 1110, where, as described in greater detail above, a cable guide connector engages a slot in a networking chassis having a length extending along a first axis. In some embodiments, the slot may be provided in a wall of the networking chassis or in a plate or tray positioned within the chassis. The cable guide connector (e.g., the magic nut) may comprise a center section that is slidable within the slot along its length and further includes a first flange at one end configured to be inserted through the slot and a second flange at the opposing end configured to engage a cable management bracket. An aperture through the center of the cable guide connector is configured to receive a retainer, such as a thumb screw.

In step 1115, as described in greater detail above, the cable guide connector slides the center section along the length of the slot to a selected position. The first flange and the second flange of the cable guide connector may have different sizes so that, in some embodiments, the first flange may be inserted through a key hole of the slot but is wider than the slot and the second flange may be larger than the first flange, to ensure that the cable guide connector may be inserted in the proper direction and may remain within the slot during use. The center section may have a size and shape that prevents the cable guide connector from rotating within the slot yet will still slide along the length of the slot along the first axis.

In step 1120, as described in greater detail above, the cable guide connector receives a protrusion of a cable management bracket in one of a plurality of apertures of the cable guide connector by rotation of the cable management bracket along a second axis to a selected position. In some embodiments, the axis of rotation may be perpendicular to the axis of the slot along which the cable guide connector may be slid. In addition, the second flange of the cable guide connector may comprise the plurality of apertures that may engage with and receive an alignment post of the cable management bracket. In this way, the cable management bracket may be rotated to define different selected bracket angles and may further be slid to a selected position along the slot in order to provide optimum support of cables from device modules within the networking chassis.

In step 1125, as described in greater detail above, the cable guide connector receives a retainer in the aperture through the center of the cable guide connector. In some embodiments, the cable management bracket includes a corresponding aperture, such as in the second flange, and this aperture may be aligned with the aperture of the cable guide connector for receiving the retainer. By tightening down on the retainer (e.g., applying compression), the cable guide connector may be secured at the selected position along the slot, and the cable management bracket may be secured at the selected bracket angle. In some embodiments, the retainer may be a spring loaded thumb screw to more readily reset the positions. Procedure 1100 then ends at step 1130.

It should be noted that while certain steps within procedure 1100 may be optional as described above, the steps shown in FIG. 11 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

Thus, the techniques described herein, provide for an adjustable cable guide that can be used to effectively and efficiently organize cables for egress within a networking chassis. In particular, different cable/fiber exit orientations may be selected by rotational positioning of a cable management bracket of the cable guide, and the profile of the cable management bracket may maintain a proper cable bend radius. Furthermore, different positions along the length of a slot in networking chassis may be selected by a sliding feature of the cable guide connector of the cable guide, even if the rotation position is set, in order to better align the cable guide to the cable/fiber exit positions and to avoid interference with adjacent modules/line-cards. The techniques further provide for a cable guide that is an easy to use and can be provided as a kit of separate components or as a pre-assembled unit. The adjustable features (e.g., rotation along one axis and sliding/translation along a different axis) offer flexibility to a user, particularly those using a large number of brackets in a tight space.

While there have been shown and described illustrative embodiments that provide for cable management, it is to be understood that various other adaptations and modifications may be made within the spirit and scope of the embodiments herein. For example, while an exemplary configuration of orthogonal rotational and sliding axes are shown, other angles between axes may be used. Furthermore, while three alignment pin/aperture combinations, separated by angles of between about angles of 45°, are shown, more or fewer rotational positions of varying intervals may be provided in other embodiments.

The foregoing description has been directed to specific embodiments. It will be apparent, however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An apparatus comprising:
 a cable management bracket; and
 a cable guide connector configured to engage a slot of a networking chassis having a length extending along a first axis, the cable guide connector comprising:
  a center section configured to slide within the slot along the first axis and having an aperture configured to receive a retainer to secure the cable guide connector by compression at a selected position along the length of the slot;

a first flange extending from a first end of the center section, the first flange configured to be inserted through the slot; and a second flange extending from a second end of the center section opposite that of the first end of the center section, the second flange defining a plurality of apertures configured to engage a protrusion of the cable management bracket and define a plurality of selectable angles at which the cable management bracket can be positioned relative to a second axis that is perpendicular to the first axis through which the slot extends.

2. The apparatus of claim 1, wherein the center section has a cross-sectional shape configured to prevent the cable guide connector from rotating within the slot.

3. The apparatus of claim 1, wherein the retainer is a thumb screw insertable through the aperture of the center section to supply the compression.

4. The apparatus of claim 1, wherein the retainer comprises a compression spring that supplies the compression.

5. The apparatus of claim 1, wherein the cable management bracket is engaged with the second flange of the cable guide connector.

6. The apparatus of claim 1, wherein the cable management bracket comprises:

an elongated section configured to support one or more cables in the networking chassis;

a first end comprising the protrusion configured to engage one of the plurality of apertures in the second flange; and a second end configured to enable rotation of the cable management bracket about the second axis.

7. The apparatus of claim 6, wherein the elongated section has one or more curved outer surfaces.

8. The apparatus of claim 6, wherein the second flange of the cable guide connector is configured to be inserted into a cavity in the first end of the cable management bracket.

9. The apparatus of claim 6, wherein the plurality of selectable angles are separated by intervals between 30°-45°.

10. The apparatus of claim 6, wherein the first end of the cable management bracket comprises an aperture aligned with the aperture of the center section of the cable guide connector and configured to receive the retainer.

11. An apparatus comprising:

a cable guide connector configured to engage a slot of a networking chassis having a length extending along a first axis, wherein the cable guide connector comprises:

a center section configured to slide within the slot along the first axis and having an aperture configured to receive a retainer to secure the cable guide connector by compression at a selected position along the length of the slot;

a first flange connected to a first end of the center section, the first flange configured to be inserted through the slot; and a second flange connected to a second end of the center section; and a cable management bracket configured to engage the cable guide connector, the cable management bracket comprising:

an elongated section configured to support one or more cables in the networking chassis;

a first end having a protrusion configured to engage one of a plurality of apertures in the cable guide connector and define a plurality of selectable angles at which the cable management bracket can be positioned relative to a second axis that is perpendicular to the first axis through which the slot extends; and a second end configured to enable rotation of the cable management bracket about the second axis wherein the second flange of the cable guide connector defines the plurality of apertures configured to engage the protrusion of the cable management bracket and define the plurality of selectable angles by rotation about the second axis.

12. The apparatus of claim 11, wherein the elongated section has one or more curved outer surfaces.

13. The apparatus of claim 11, wherein the plurality of selectable angles are separated by intervals between 30°-45°.

14. The apparatus of claim 11, wherein the cable guide connector is engaged with the first end of the cable management bracket.

15. The apparatus of claim 11, wherein the second flange of the cable guide connector is configured to be inserted into a cavity in the first end of the cable management bracket.

16. The apparatus of claim 11, wherein the center section has a cross-sectional shape configured to prevent the cable guide connector from rotating within the slot.

17. The apparatus of claim 11, wherein the retainer is a thumb screw insertable into the aperture of the center section to supply the compression.

18. The apparatus of claim 11, wherein the retainer comprises a compression spring that supplies the compression.

19. A method comprising:

engaging, by a cable guide connector, a slot in a networking chassis having a length extending along a first axis, sliding, by the cable guide connector, a center section of the cable guide connector along the length of the slot to a selected position;

receiving, by the cable guide connector, a protrusion of a cable management bracket in one of a plurality of apertures of the cable guide connector by rotation of the cable management bracket along a second axis that is perpendicular to the first axis to a selected bracket angle; and receiving, by the cable guide connector, a retainer in an aperture through the center section of the cable guide connector to secure the cable guide connector at the selected position and the cable management bracket at the selected bracket angle.

20. The method of claim 19, wherein the center section has a cross-sectional shape configured to prevent the cable guide connector from rotating within the slot.

* * * * *